United States Patent [19]

Yang et al.

[11] Patent Number: 5,633,210

[45] Date of Patent: May 27, 1997

[54] METHOD FOR FORMING DAMAGE FREE PATTERNED LAYERS ADJOINING THE EDGES OF HIGH STEP HEIGHT APERTURES

[75] Inventors: Bao R. Yang, I-Lan; Sen F. Chen, Taipei; Wen C. Chang, Tao Yuan; Po-Tau Chu, Hsin-Chu, all of Taiwan

[73] Assignee: Taiwan Semiconductor Manufacturing Company, Ltd., Hsinchu, Taiwan

[21] Appl. No.: 638,672

[22] Filed: Apr. 29, 1996

[51] Int. Cl.$^6$ .................................... H01L 21/465
[52] U.S. Cl. .............. 438/669; 438/699; 438/703; 438/636
[58] Field of Search ................ 437/226, 227, 437/229, 228 PL, 228 TR, 245

[56] References Cited

U.S. PATENT DOCUMENTS 5,324,689  6/1994  Yoo ........................ 437/228 PL
5,326,727  7/1994  Kook et al. ................. 437/229

OTHER PUBLICATIONS

S. Wolf, "Silicon Processing for the VLSI Era—vol. 1" Lattice Press, Sunset Beach, CA. p. 441.

Primary Examiner—Trung Dang
Attorney, Agent, or Firm—George O. Saile; Alek P. Szecsy

[57] ABSTRACT

A method for forming damage free patterned layers adjoining the edges of high step height apertures within integrated circuits. There is first provided a semiconductor substrate which has a first aperture formed therein. Formed upon the semiconductor substrate and into the first aperture is a blanket layer. The blanket layer has a second aperture formed therein where the blanket layer is formed into the first aperture. Formed then into the second aperture is a buffer layer. The buffer layer substantially planarizes the blanket layer. Formed then upon the semiconductor substrate is a blanket photoresist layer. The blanket photoresist layer and the blanket layer are then sequentially patterned to form a patterned photoresist layer and a damage free patterned layer.

23 Claims, 4 Drawing Sheets

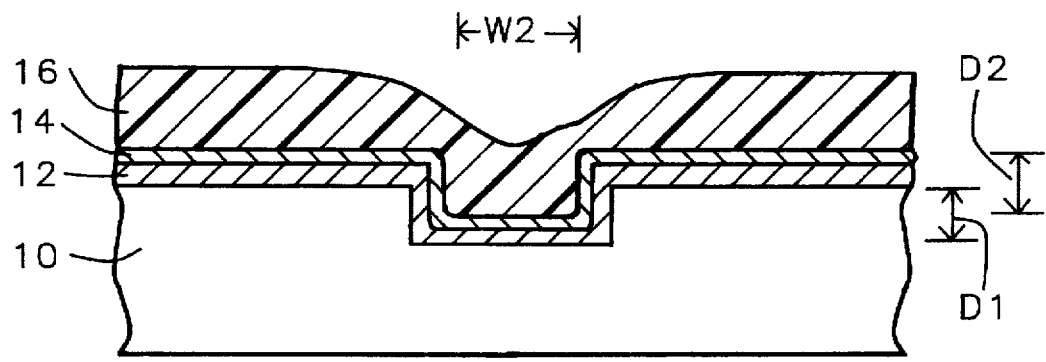
FIG. 1 - Prior Art
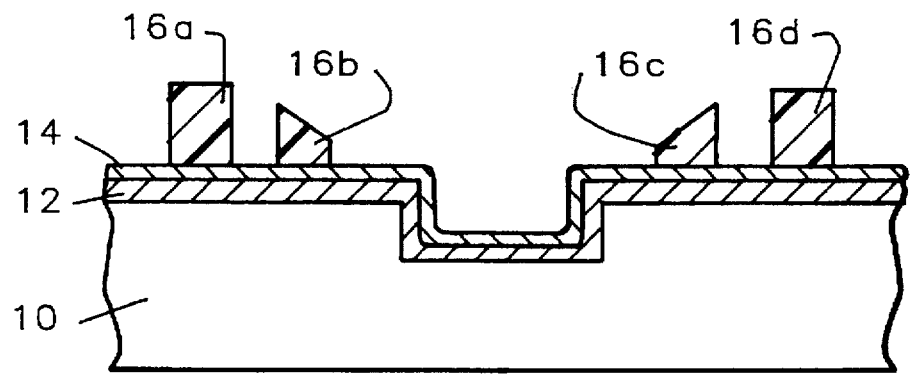
FIG. 2 - Prior Art
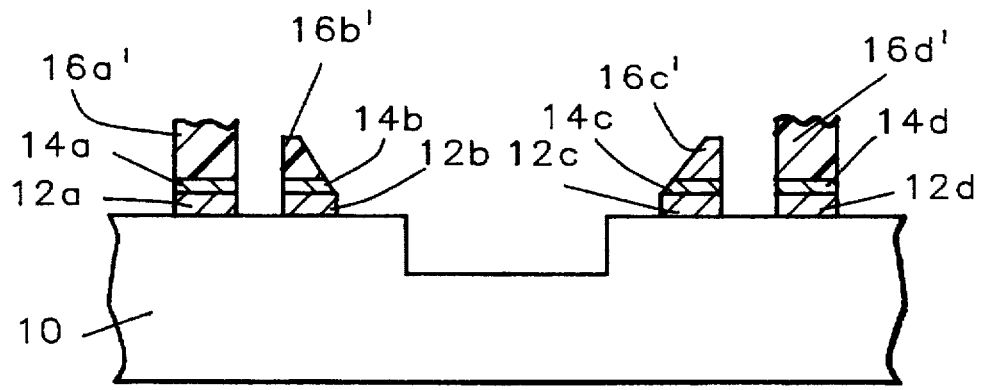
FIG. 3 - Prior Art

METHOD FOR FORMING DAMAGE FREE PATTERNED LAYERS ADJOINING THE EDGES OF HIGH STEP HEIGHT APERTURES

BACKGROUND OF THE INVENTION

1. Field of the Invention

The present invention relates generally to methods and materials for forming patterned layers within integrated circuits. More particularly, the present invention relates to methods and materials for forming damage free patterned layers adjoining the edges of high step height apertures within integrated circuits.

2. Description of the Related Art

Integrated circuits are formed from semiconductor substrates within and upon whose surfaces are formed transistors, resistors, diodes and other electrical circuit elements. These electrical circuit elements are interconnected internally and externally to the semiconductor substrate upon which they are formed through patterned conductor layers which are separated by insulator layers.

Within the context of the multi-step method by which integrated circuit chips are formed from semiconductor substrates within and upon whose surfaces are formed integrated circuits, there exist two discrete process steps at the end of the method. The two discrete process steps are: (1) the final conductor metallization process step whereby final conductor bonding pad layers are formed, in part, around the periphery of an integrated circuit to provide locations for connection to electrical circuits and electrical circuit elements external to the integrated circuit, and (2) the scribing and parting process step whereby a semiconductor substrate having discrete integrated circuits formed within and upon its surface is divided into discrete integrated circuit chips.

It is common in the art of integrated circuit manufacture for the final conductor metallization process and the scribing and parting process to be intertwined. In particular, it is common for: (1) semiconductor substrates to be scribed prior to forming upon those semiconductor substrates final conductor bonding pad layers, and (2) semiconductor substrates to be parted after forming upon those semiconductor substrates final conductor bonding pad layers. Such an ordering of process steps typically provides for significant reductions in physical stress within the semiconductor substrate from which is formed the integrated circuit chips while simultaneously providing economy in manufacturing and ease of alignment of photolithographic masks upon the semiconductor substrate.

As a separate consideration with regard, in general, to photolithographic processes by which conductor layers are patterned within semiconductor substrates, it is also recognized in the art that photoresists employed in those photolithographic processes often suffer from inhomogeneous standing wave photo-exposures when those photoresists are photo-exposed directly upon a highly reflective conductor metal layer such as aluminum or an aluminum alloy conductor metal layer. In order to provide homogeneous photo-exposure of the photoresists formed upon a highly reflective conductor metal layer, Anti-Reflective Coating (ARC) layers are often formed upon the top surface of the highly reflective conductor metal layer. The use of such Anti-Reflective Coatings (ARCs) is in general disclosed by S. Wolf et al. in Silicon Processing for the VLSI Era, Volume 1: Process Technology, (Lattice Press: Sunset Beach, Calif.) (1986) pg. 441. Commonly, although not exclusively, a titanium nitride layer is employed as an Anti-Reflective Coating (ARC) layer.

By virtue of the ordering of the process steps associated with the scribing process, the parting process and the final conductor bonding pad metallization process, along with the materials employed within those processes, an integrated circuit structure similar to the integrated circuit structure illustrated in FIG. 1 is common in the art.

Shown in FIG. 1 is a semiconductor substrate 10 having scribed into its surface a kerf of width W1 and depth D1, which kerf separates portions of the semiconductor substrate 10 which are to be parted into separate integrated circuit chips. Formed conformally upon the semiconductor substrate 10 and conformally into the kerf is a blanket final conductor layer 12, and formed upon the blanket final conductor layer 12 is a blanket conformal Anti-Reflective Coating (ARC) layer 14 which has an aperture of width W2 and depth D2 formed therein at the location upon the semiconductor substrate 10 where the blanket final conductor layer 12 is formed into the kerf. Formed upon the surface of the blanket conformal Anti-Reflective Coating (ARC) layer 14 is a blanket photoresist layer 16. Due to the visco-elastic properties of the photoresist material from which is formed the blanket photoresist layer 16, the blanket photoresist layer 16 is thinner upon portions of the semiconductor substrate 10 near the edges of the kerf than upon other portions of the semiconductor substrate 10.

Shown in FIG. 2 and FIG. 3 are the results of further processing of the semiconductor substrate 10 whose structure is illustrated in FIG. 1. Shown in FIG. 2 is the patterning of the blanket photoresist layer 16 to yield the patterned photoresist layers 16a, 16b, 16c and 16d. The patterned photoresist layers 16a and 16d are typically employed as an etch mask in forming patterned final conductor bonding pads layers upon the surface of the semiconductor substrate 10. The patterned photoresist layers 16b and 16c are typically employed as an etch mask in forming patterned final conductor seal ring layers upon the surface of the semiconductor substrate 10. As is shown in FIG. 2 the patterned photoresist layers 16b and 16c are significantly shorter in height than the patterned photoresist layers 16a and 16d, since the patterned photoresist layers 16b and 16c are formed from the thinner portions of the blanket photoresist layer 16 closer to the kerf.

Shown in FIG. 3 are the results of etching of the exposed portions of the blanket final conductor layer 12 and the blanket conformal Anti-Reflection Coating (ARC) layer 14 to form: (1) the patterned conformal Anti-Reflective Coating (ARC) layers 14a, 14b, 14c and 14d; (2) the patterned final conductor bonding pad layers 12a and 12d; and, (3) the patterned final conductor seal ring layers 12b and 12c. During the etching processing, portions of the patterned photoresist layers 16a, 16b, 16c and 16d are eroded by the etchant, which is typically a Reactive Ion Etch (RIE) etchant gas mixture. Since the patterned photoresist layers 16b and 16c are shorter in height than the patterned photoresist layers 16a and 16d, the erosion process more rapidly consumes the patterned photoresist layers 16b and 16c to yield the etched patterned photoresist layers 16b' and 16c', leading to over-etching of the patterned conformal Anti-Reflective Coating (ARC) layers 14b and 14c, and possibly also the patterned final conductor seal ring layers 12b and 12c. Such over-etching provides surfaces to which functional and reliable seals and connections may be difficult to establish. It is thus towards the specific goal of forming damage free patterned final conductor layers adjoining the edges of high step height kerfs within semiconductor substrates that the present invention is specifically directed.

The foregoing description provides a specific example of the problem towards which the present invention is directed.

In more general terms, the present invention is also directed towards providing a method whereby damage free patterned layers may be formed adjoining the edges of high step height apertures within integrated circuits. The method provided by the present invention has broader applicability than forming only damage free patterned final conductor layers adjoining the edges of high step height kerfs within semiconductor substrates.

SUMMARY OF THE INVENTION

A first object of the present invention is to provide a method for forming damage free patterned layers adjoining the edges of high step height apertures within integrated circuits.

A second object of the present invention is to provide a method in accord with the first object of the present invention, which method is also readily manufacturable.

In accord with the objects of the present invention, there is provided a method by which there may be formed damage free patterned layers adjoining the edges of high step height apertures within integrated circuits. To form the damage free patterned layers of the present invention, there is first provided a semiconductor substrate which has a first aperture formed therein. Formed upon the semiconductor substrate and into the first aperture is a blanket layer. The blanket layer has a second aperture formed therein where the blanket layer is formed into the first aperture. Formed then into the second aperture is a buffer layer. The buffer layer substantially planarizes the blanket layer. Formed then upon the blanket layer is a blanket photoresist layer. The blanket photoresist layer and the blanket layer are then sequentially patterned to form a patterned photoresist layer and a patterned layer.

The present invention provides a method for forming damage free patterned layers at the edges of high step height apertures within integrated circuits. By forming into the second aperture within the blanket layer a buffer layer which substantially planarizes the blanket layer, there is formed by the method of the present invention a substantially planar surface upon which a blanket photoresist layer may be formed. By providing a substantially planar surface upon which may be formed the blanket photoresist layer, the blanket photoresist layer may also be substantially planar. A substantially planar blanket photoresist layer will provide consistent protection, when patterned into a patterned photoresist layer which serves as an etch mask, for patterning the blanket layer which resides beneath the patterned photoresist layer. Thus, through the method of the present invention there is formed a damage free patterned layer adjoining the edges of a high step height aperture within an integrated circuit.

The method of the present invention is readily manufacturable. In comparison with methods conventional to the art, the method of the present invention provides that a second aperture within a blanket layer, where the blanket layer is formed into a first aperture within a semiconductor substrate, is first substantially planarized with a buffer layer, prior to forming upon the blanket layer a blanket photoresist layer which is employed in patterning the blanket layer. The presence of the substantially planarizing buffer layer assists in providing the method of the present invention. Methods and materials by which layers such as buffer layers may be formed upon semiconductor substrates are known in the art. Such methods and materials are readily manufacturable.

BRIEF DESCRIPTION OF THE DRAWINGS

The accompanying drawings, which form a material part of this disclosure, show the following:

FIG. 1 to FIG. 3 show a series of schematic cross-sectional diagrams illustrating progressive stages in forming, through a photolithography method conventional to the art, patterned final conductor layers adjoining the edges of a kerf formed into a semiconductor substrate.

DESCRIPTION OF THE PREFERRED EMBODIMENTS

The present invention provides a method for forming a damage free patterned layer adjoining the edges of an aperture within a semiconductor substrate. In a general preferred embodiment of the present invention, the patterned layer is patterned from a blanket layer formed from a conductor material, an insulator material or a semiconductor material; and the aperture may be any aperture of sufficient width and depth such that the patterned layer is normally damaged through over-etching due to thinning of portions of a patterned photoresist etch mask through which the blanket layer is etched to form the patterned layer.

In a more specific embodiment of the present invention, the blanket layer is a blanket final conductor layer upon which resides a blanket conformal Anti-Reflective Coating (ARC) layer, and the aperture is a kerf formed between adjoining portions of a semiconductor substrate which are to be parted into individual integrated circuit chips.

The method of the present invention provides that a second aperture which is formed in the blanket layer when the blanket layer is formed in the aperture within the semiconductor substrate is substantially planarized by a buffer layer prior to forming upon the surface of the blanket layer a blanket photoresist layer. Sequentially there is then formed: (1) a patterned photoresist layer from the blanket photoresist layer, and (2) a patterned layer from the blanket layer by use of the patterned photoresist layer as an etch mask.

The method of the present invention may be employed in forming damage free patterned layers adjoining apertures within semiconductor substrates including but not limited to semiconductor substrates upon which are formed Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability in forming patterned layers adjoining apertures within semiconductor substrates.

Figure 4:
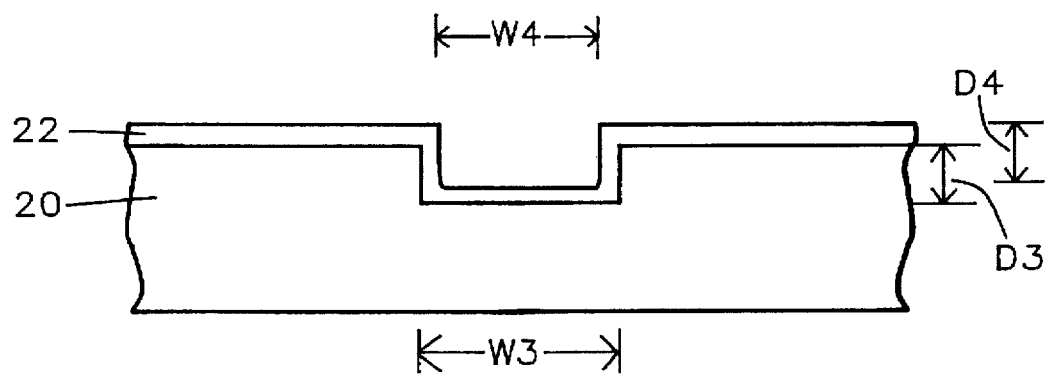
FIG. 4 to FIG. 7 show a series of schematic cross-sectional diagrams illustrating progressive stages in forming patterned layers adjoining the edges of an aperture within a semiconductor substrate, in accord with the first preferred embodiment of the method of the present invention.

Referring now to FIG. 4 to FIG. 7 there is shown a series of schematic cross-sectional diagrams illustrating progressive stages in forming a damage free patterned layer adjoining the edges of an aperture within a semiconductor substrate in accord with the first preferred embodiment of the method of the present invention. Shown in FIG. 4 is a schematic cross-sectional diagram of the semiconductor substrate at early stages in its processing.

Shown in FIG. 4 is a semiconductor substrate 20 having formed therein a first aperture of width W3 and of depth D3. Although the method of the first preferred embodiment of the present invention may be practiced upon semiconductor substrates having any doping type, any doping concentration and any crystallographic orientation, the semiconductor substrate 20 within the first preferred embodiment of the method of the present invention will preferably be a (100) silicon semiconductor substrate having an N- or P- doping. For the first preferred embodiment of the method of the present invention the width W3 of the first aperture is preferable from about 1E6 to about 1.5E6 angstroms and the depth D3 of the first aperture is preferably from about 1E4 to about 2E4 angstroms.

Also shown in FIG. 4 is a blanket layer 22, which blanket layer 22 is ultimately desired to be patterned into a damage free patterned layer adjoining the edges of the first aperture. For the first preferred embodiment of the method of the present invention, the blanket layer 22 may be formed of materials including but not limited to insulator materials, conductor materials and semiconductor materials. Preferably, the blanket layer 22 will have a thickness of from about 4000 to about 12000 angstroms. Typically, the blanket layer 22 will be at least partially conformal, thus there will be formed into the blanket layer a second aperture of width W4 and depth D4 where the blanket layer 22 is formed into the first aperture within the semiconductor substrate 20. Given the limited preferred thickness of the blanket layer 22 with respect to the width W3 of the first aperture, as well as the typical conformality of the blanket layer 22, the width W4 of the second aperture is thus also preferably from about 1E6 to about 1.5E6 angstroms and the depth D4 of the second aperture is also preferably from about 1E4 to about 2E4 angstroms.

Figure 5:
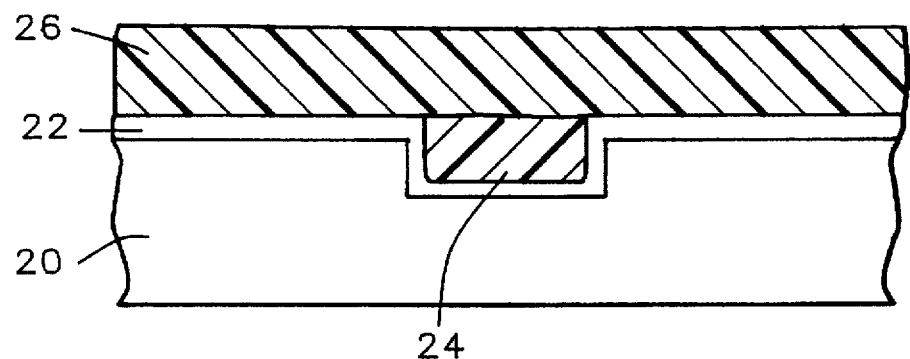

Referring now to FIG. 5 there is shown a cross-sectional schematic diagram illustrating the results of further stages in processing of the semiconductor substrate 20 illustrated in FIG. 4. Shown in FIG. 5 is the presence of a buffer layer 24 formed into the second aperture. For the first preferred embodiment of the method of the present invention, the buffer layer 24 may be formed from any of several types of materials, including but not limited to organic polymer materials, insulator materials and photoresist materials. It is desirable for the first preferred embodiment of the method of the present invention that the buffer layer 24 both: (1) substantially planarize the surface of the blanket layer 22, and (2) readily flow into the second aperture within the blanket layer 22. Thus, although several materials may be employed in forming the buffer layer 24, the buffer layer 24 is preferably formed of an organic polymer material having a viscosity of from about 10 to about 50 centipoise, as coated. The organic polymer material from which is formed the buffer layer 24 may be coated into the second aperture within the blanket layer 22 through methods as are conventional in the art, including but not limited to spin coating methods.

Although not specifically illustrated by FIG. 5, it is also acceptable within the first preferred embodiment of the method of the present invention that the buffer layer 24 may also have portions which reside upon portions of the blanket layer 22 outside of the second aperture. Under such circumstances, the buffer layer 24 will in addition to planarizing the blanket layer 22 also form a contiguous layer upon the surface of the blanket layer 22.

Also illustrated in FIG. 5 is the presence of a blanket photoresist layer 26 formed upon the blanket layer 22 whose surface is planarized by forming the buffer layer 24 into the second aperture. The blanket photoresist layer 26 is subsequently patterned and employed as an etch mask in patterning the blanket layer 22 through the method of the first preferred embodiment of the present invention. Methods and materials through which blanket photoresist layers may be formed upon the surfaces of semiconductor substrates are known in the art. Blanket photoresist layers may be formed upon semiconductor substrates from photoresist materials including but not limited to novolak photoresist materials and Poly Methyl Meth Acrylate (PMMA) photoresist materials, typically, although not exclusively, deposited upon those semiconductor substrates through spin coating methods. For the first preferred embodiment of the method of the present invention, the blanket photoresist layer 26 may be formed of a photoresist material chosen from the group of photoresist materials including but not limited to novolak photoresist materials and Poly Methyl Meth Acrylate (PMMA) photoresist materials. Preferably, the blanket photoresist layer 26 is spin coated upon the planarized surface of the blanket layer 22 at a thickness of from about 5000 to about 20000 angstroms.

Figure 6:
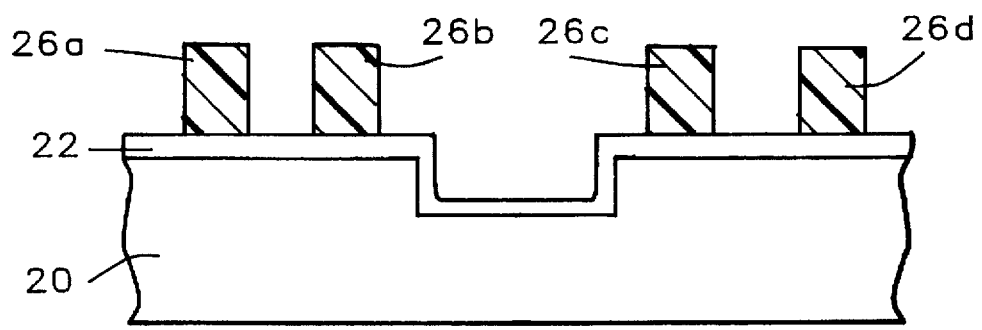

Referring now to FIG. 6 there is shown a schematic cross-sectional diagram illustrating the results of further stages in processing of the semiconductor substrate 20 illustrated in FIG. 5. Shown in FIG. 6 is the presence of patterned photoresist layers 26a, 26b, 26c and 26d which are formed through photo-exposure and development of blanket photoresist layer 26, along with removal of the buffer layer 24. Methods and materials through which blanket photoresist layers may be patterned and developed to yield patterned photoresist layers are known in the art. In addition, methods and materials through which buffer layers, such as the buffer layer 24, may be removed from semiconductor substrates are also known in the art. Typically, although not exclusively, blanket photoresist layers are patterned to yield patterned photoresist layers through photo-exposure processes followed by development in wet chemical etchants. Sequentially, buffer layers such as buffer layer 24 may be removed through etchants appropriate to the materials from which is formed the buffer layer. For the first preferred embodiment of the method of the present invention, the buffer layer 24 which is preferably formed of an organic polymer material is preferably removed through immersion in a photoresist stripping solution.

As is shown in FIG. 6, the heights of the patterned photoresist layers 26a, 26b, 26c and 26d are all substantially equal, due to the presence of buffer layer 24 which planarizes the surface of the blanket layer 22 when the when the blanket photoresist layer 26 is formed and subsequently patterned into the patterned photoresist layers 26a, 26b, 26c and 26d. In particular, the heights of the two patterned photoresist layers 26b and 26c which most closely adjoin the first aperture and the second aperture are substantially higher when formed through the method of the first preferred embodiment of the present invention than are analogous patterned photoresist layers formed through methods conventional to the art absent a buffer layer.

Figure 7:
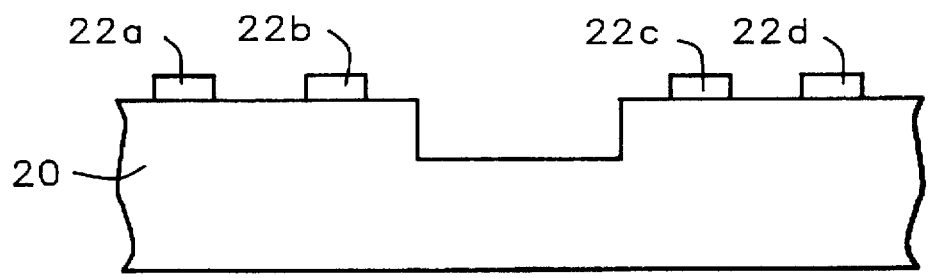

Referring now to FIG. 7 there is shown a schematic cross-sectional diagram illustrating the results of the last stages in the processing employed in forming the damage free patterned layers through the method of the first preferred embodiment of the present invention. Shown in FIG. 7 is the presence of patterned layers 22a, 22b, 22c and 22d formed through etching of the blanket layer 22 using as an etch mask the patterned photoresist layers 26a, 26b, 26c and 26d, followed by removal of the etched patterned photoresist layers 26a, 26b, 26c and 26d. Methods and materials through which blanket layers may be etched to form patterned layers defined by photoresist etch masks are known in the art. Such methods include but are not limited to wet chemical etch methods and Reactive Ion Etch (RIE) plasma etch methods employing etchant materials appropriate to the material from which is formed the blanket layer. For the first preferred embodiment of the method of the present invention, the patterned layers 22a, 22b, 22c and 22d are preferably etched from the blanket layer 22 through a Reactive Ion Etch (RIE) etch method employing an etchant gas mixture appropriate to the material from which is formed the blanket layer 22. Typically, the patterned layers 22b and 22c which most closely adjoin the edge of first aperture will be spaced at a distance of from about 6E4 to about 7E4 angstroms from the edge of the first aperture.

Since, as illustrated in FIG. 6, the patterned photoresist layers 26a, 26b, 26c and 26d are all of approximately equal height, each of the patterned layers 22a, 22b, 22c and 22d is formed without damage from over-etching due to thinning of the corresponding patterned photoresist layer which serves as the etch mask for patterning of that patterned layer. Thus, upon etching the patterned layers 22a, 22b, 22c and 22d from the blanket layer 22, and removing from the surfaces of the patterned layers 22a, 22b, 22c and 22d the etched residues of the patterned photoresist layers 26a, 26b, 26c and 26d, there are formed the damage free patterned layers 22a, 22b, 22c and 22d through the method of the first preferred embodiment of the present invention at the edge of a high step height aperture within a semiconductor substrate.

In addition to the first preferred embodiment of the present invention, which is directed towards a general embodiment of the present invention, there also exists a second preferred embodiment of the present invention which is directed to a more specific embodiment of the present invention. The more specific embodiment to which the second preferred embodiment of the present invention is directed relates to the over-etching of patterned Anti-Reflective Coating (ARC) layers formed upon patterned final conductor layers adjoining high step height kerfs formed within semiconductor substrates, as illustrated by reference to FIG. 1 to FIG. 3 and discussed within the Description of the Related Art of this disclosure. The fashion by which the method of the present invention is adapted to this embodiment is illustrated by reference to FIG. 8 to FIG. 11.

Figure 8:
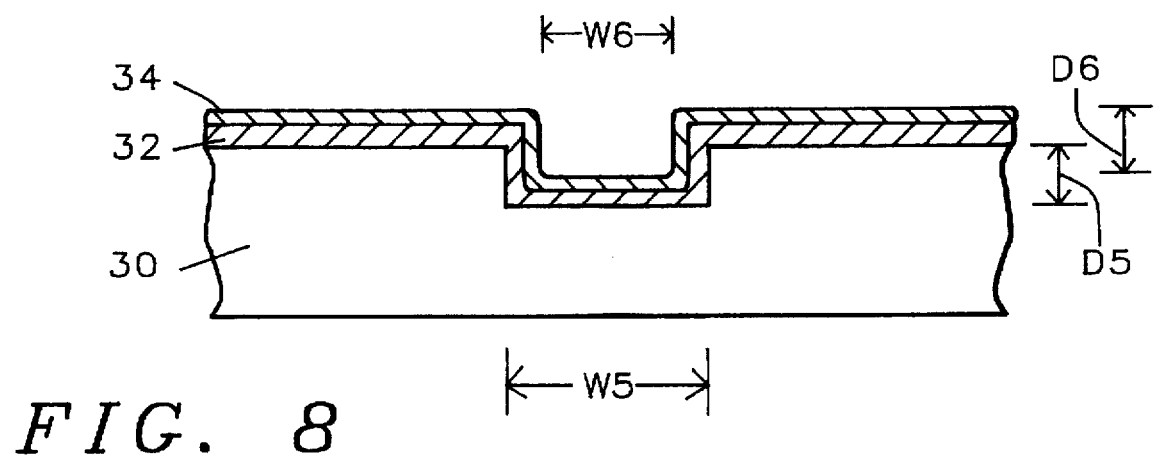
FIG. 8 to FIG. 11 show a series of schematic cross-sectional diagrams illustrating progressive stages in forming patterned final conductor layers adjoining the edges of a kerf formed into a semiconductor substrate, in accord with the second preferred embodiment of the method of the present invention.

Referring specifically to FIG. 8, there is shown a schematic cross-sectional diagram illustrating the results of the early stages in processing of a semiconductor substrate in accord with the second preferred embodiment of the method of the present invention. Shown in FIG. 8 is a semiconductor substrate 30 having formed therein a kerf of width W5 and depth D5. The kerf separates portions of the semiconductor substrate 30 which are subsequently parted to form integrated circuit chips. Analogously with the first aperture within the semiconductor substrate 20 of the first preferred embodiment of the method of the present invention, the width W5 of the kerf is preferably from about 1E6 to about 1.5E6 angstroms and the depth D5 of the kerf is preferably from about 1E4 to about 2E4 angstroms.

Formed upon the semiconductor substrate 30 and into the kerf is a blanket final conductor layer 32. The blanket final conductor layer 32 is preferably at least in part conformal. Formed upon the blanket final conductor layer 32 is a blanket conformal Anti-Reflective Coating (ARC) layer 34. Formed within the blanket conformal Anti-Reflective Coating (ARC) layer 34 is an aperture of width W6 and depth D6 where the blanket final conductor layer 32 is formed into the kerf. Methods and materials through which blanket final conductor layers and blanket conformal Anti-Reflective Coating (ARC) layers may be formed upon the surfaces of semiconductor substrates are known in the art. Blanket final conductor layers and blanket conformal Anti-Reflective Coating (ARC) layers may be formed through methods including but not limited to thermally assisted evaporation methods, electron beam assisted evaporation methods, Chemical Vapor Deposition (CVD) methods, Plasma Enhanced Chemical Vapor Deposition (PECVD) methods and Physical Vapor Deposition (PVD) sputtering methods. Blanket final conductor layers are typically, although not exclusively formed of conductor materials including but not limited to metals, metal alloys and highly doped polysilicon. Blanket conformal Anti-Reflective Coating (ARC) layers are typically, although not exclusively, formed of Anti-Reflective Coating (ARC) materials including but not limited to titanium nitride materials, silicon oxide materials, silicon oxynitride materials and deeply absorbing photoresist materials.

For the second preferred embodiment of the method of the present invention, the blanket final conductor layer 32 is preferably formed of a metal alloy formed at least in part of aluminum. For the second preferred embodiment of the method of the present invention, the blanket final conductor layer 32 is preferably formed upon the surface of the semiconductor substrate 30 and into the kerf within the semiconductor substrate 30 at a thickness of from about 4000 to about 8000 angstroms. For the second preferred embodiment of the method of the present invention, the blanket conformal Anti-Reflective Coating (ARC) layer 34 is preferably formed of a titanium nitride. For the second preferred embodiment of the method of the present invention, the blanket conformal Anti-Reflective Coating (ARC) layer 34 is preferably formed upon the surface of the blanket final conductor layer 32 at a thickness of from about 250 to about 1500 angstroms. Due to the limited preferred thicknesses of the blanket final conductor layer 32 and the blanket conformal Anti-Reflective Coating (ARC) 34 layer with respect to the kerf, as well as the preferred conformality of the blanket final conductor layer 32 and the blanket conformal Anti-Reflective Coating (ARC) layer 34, the width W6 of the aperture within the blanket conformal Anti-Reflective Coating (ARC) layer 34 is also preferably from about 1E6 to about 1.5E6 angstroms and the depth D6 of the aperture is also preferably from about 1E4 to about 2E4 angstroms.

Figure 9:
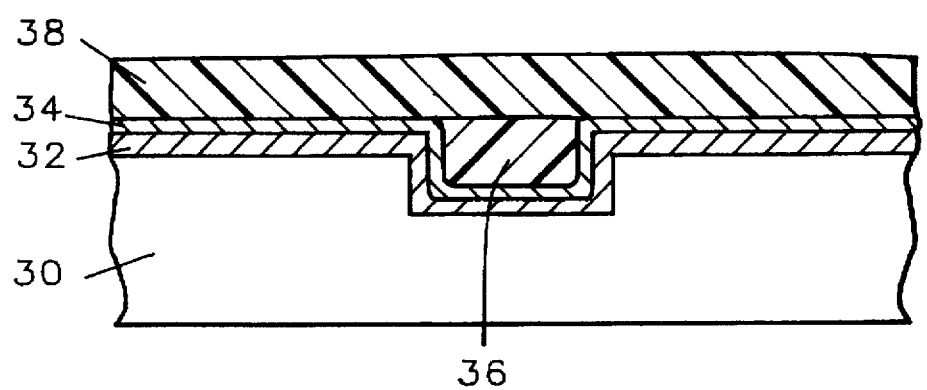

Referring now to FIG. 9 there is shown a schematic cross-sectional diagram which illustrates the results of further stages in processing of the semiconductor substrate 30 illustrated in FIG. 8. Shown in FIG. 9 is the presence of a buffer layer 36 filled into the aperture within the blanket conformal Anti-Reflective Coating (ARC) layer 34 and planarizing the surface of the blanket conformal Anti-Reflective Coating (ARC) layer 34. Analogously to the buffer layer 24 employed in the first preferred embodiment of the method of the present invention, the buffer layer 36 within the second preferred embodiment of the method of the present invention is preferably, although not exclusively, formed of an organic polymer material of appropriate viscoelastic characteristics to efficiently fill the aperture and planarize the surface of the blanket conformal Anti-Reflective Coating (ARC) layer 34. Preferably, the organic polymer material has a viscosity of from about 10 to about 50 centipoise, as coated. Preferably, the buffer layer 36 is formed of an organic polymer material which is also readily removed by the etchant which is employed in developing a blanket photoresist layer which is subsequently patterned upon the surface of the blanket conformal Anti-Reflective Coating (ARC) layer 34.

Analogously to the buffer layer 24 within the first preferred embodiment of the method of the present invention, the buffer layer 36 within the second preferred embodiment of the method of the present invention may also be formed of a thickness such that surfaces of the blanket conformal Anti-Reflective Coating (ARC) layer 34 adjoining the kerf are also planarized by the buffer layer 36.

Also shown in FIG. 9 is the presence of a blanket photoresist layer 38 formed upon the surface of the blanket conformal Anti-Reflective Coating (ARC) layer 34 planarized by the buffer layer 36. The blanket photoresist layer 38 is employed in patterning within the second preferred embodiment of the method of the present invention the blanket conformal Anti-Reflective Coating (ARC) layer 34 and the blanket final conductor layer 32. Analogously with the blanket photoresist layer 26 within the first preferred embodiment of the method of the present invention, the blanket photoresist layer 38 within the second preferred embodiment of the method of the present invention may also be formed of several photoresist materials, including but not limited to of novolak photoresist materials and Poly Methyl Meth Acrylate (PMMA) photoresist materials. Preferably, the blanket photoresist layer 38 is from about 5000 to about 15000 angstroms thick.

Figure 10:
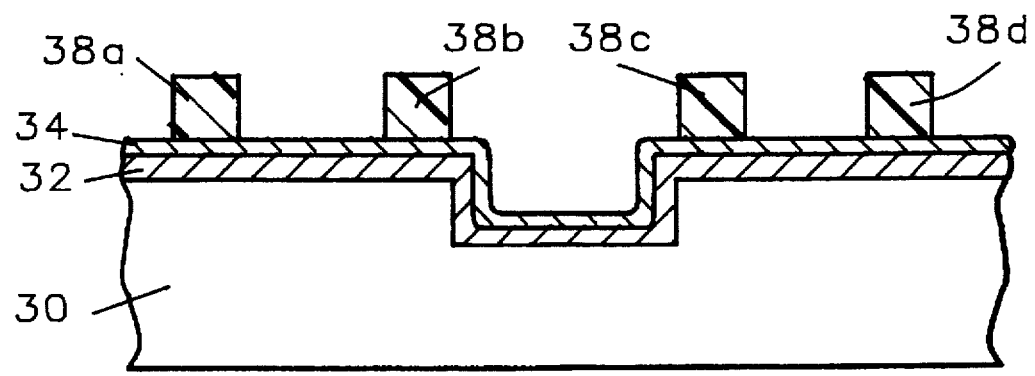

Referring now to FIG. 10 there is shown a schematic cross-sectional diagram illustrating the results of further stages in processing of the semiconductor substrate 30 illustrated in FIG. 9. Shown in FIG. 10 is the presence of patterned photoresist layers 38a, 38b, 38c and 38d which are formed through patterning of the blanket photoresist layer 38 through methods and materials analogous to the methods and materials through which the patterned photoresist layers 26a, 26b, 26c and 26d are formed from the blanket photoresist layer 26 within the first preferred embodiment of the method of the present invention. Analogously and for the same reasons as discussed within the first preferred embodiment of the method of the present invention, the patterned photoresist layers 38a, 38b, 38c and 38d within the second preferred embodiment of the method of the present invention are also of approximately equivalent height.

Figure 11:
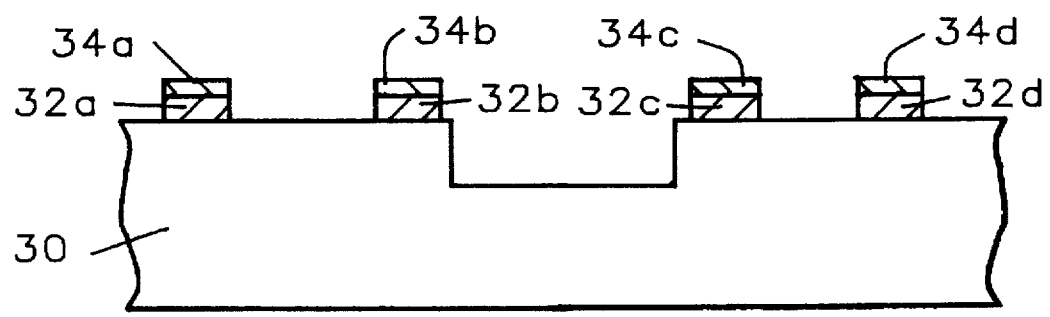

Referring now to FIG. 11 there is show a schematic cross-sectional diagram illustrating the results of the last series of process steps in forming the damage free patterned final conductor layers adjoining a kerf within a semiconductor substrate, in accord with the method of the second preferred embodiment of the present invention. Shown in FIG. 11 are: (1) the patterned conformal Anti-Reflective Coating (ARC) layers 34a, 34b, 34c and 34d which are formed through patterning of the blanket conformal Anti-Reflective Coating (ARC) layer 34; (2) the patterned final conductor bonding pad layers 32a and 32d which are formed through patterning of the blanket final conductor layer 32; and, (3) the patterned final conductor seal ring layers 32b and 32c which are also formed through patterning of the blanket final conductor layer 32. The preceding set of eight patterned layers is formed through patterning their corresponding blanket layers by employing the patterned photoresist layers 38a, 38b, 38c and 38d as an etch mask. For the second preferred embodiment of the method of the present invention, the preceding set of eight patterned layers is preferably etched from their corresponding blanket layers through a Reactive Ion Etch (RIE) etch method employing an etchant gas mixture appropriate to the materials from which are formed the blanket conformal Anti-Reflective Coating (ARC) layer 34 and the blanket final conductor layer 32. Typically, the patterned final conductor seal ring layers 32b and 32c which reside most closely to the kerf are formed at a distance of from about 6E4 to about 7E4 angstroms from the edges of the kerf.

Since, as illustrated in FIG. 10, the patterned photoresist layers 38a, 38b, 38c and 38d are all of approximately equal height, each of the patterned layers within the preceding set of eight patterned layers is formed without damage from overetching due to thinning of the corresponding patterned photoresist layer which serves as the etch mask for patterning of that patterned layer. Thus, there is formed through the second preferred embodiment of the method of the present invention damage free pattered final conductor bonding pad layers 32a and 32d; damage free patterned final conductor seal ring layers 32b and 32c; and damage free patterned conformal Anti-Reflective Coating (ARC) layers 34a, 34b, 34c and 34d adjoining the edges of a high step height kerf formed within a semiconductor substrate.

What is claimed is:

1. A method for forming a patterned layer comprising:

providing a semiconductor substrate, the semiconductor substrate having a kerf formed therein;

forming upon the semiconductor substrate and into the kerf a blanket layer, the blanket layer having an aperture formed therein where the blanket layer is formed into the kerf;

forming a buffer layer into the aperture, the buffer layer substantially planarizing the blanket layer;

forming then a blanket photoresist layer upon the semiconductor substrate; and, patterning sequentially the blanket photoresist layer and the blanket layer to form a patterned photoresist layer and a patterned layer.

2. The method of claim 1 wherein the kerf is from about 1E6 to about 1.5E6 angstroms in width upon the semiconductor substrate.

3. The method of claim 1 wherein the kerf is from about 1E4 to about 2E4 angstroms in depth within the semiconductor substrate.

4. The method of claim 1 wherein the blanket layer is formed of a material chosen from the group of materials consisting of insulator materials, conductor materials and semiconductor materials.

5. The method of claim 1 wherein the thickness of the blanket layer is from about 4000 to about 12000 angstroms.

6. The method of claim 1 wherein the aperture is from about 1E6 to about 1.5E6 angstroms in width.

7. The method of claim 1 wherein the aperture is from about 1E4 to about 2E4 angstroms in depth.

8. The method of claim 1 wherein the buffer layer is formed from an organic polymer material.

9. The method of claim 8 wherein the organic polymer material has a viscosity of from about 10 to about 50 centipoise, as coated.

10. The method of claim 1 wherein the blanket photoresist layer is formed from a photoresist material chosen from the group of photoresist materials consisting of novolak photoresist materials and Poly Methyl Meth Acrylate (PMMA) photoresist materials.

11. The method of claim 1 wherein the blanket photoresist layer is formed at a thickness of from about 5000 to about 15000 angstroms upon the surface of the semiconductor substrate.

12. The method of claim 1 wherein the blanket layer is patterned through a Reactive Ion Etch (RIE) etching method.

13. The method of claim 1 wherein the patterned layer is from about 6E4 to about 7E4 angstroms from the first aperture.

14. A method for forming a patterned final conductor layer comprising:

providing a semiconductor substrate, the semiconductor substrate having a kerf formed therein;

forming upon the semiconductor substrate and into the kerf a blanket final conductor layer, the blanket final conductor layer having a blanket conformal Anti-Reflective Coating (ARC) layer formed thereon, the blanket conformal Anti-Reflective Coating (ARC) layer having an aperture formed therein where the blanket final conductor layer is formed into the kerf;

forming a buffer layer into the aperture, the buffer layer substantially planarizing the blanket conformal Anti-Reflective Coating (ARC) layer;

forming then a blanket photoresist layer upon the semiconductor substrate; and, patterning sequentially the blanket photoresist layer, the blanket Anti-Reflective Coating (ARC) layer and the blanket final conductor layer to form a patterned photoresist layer, a patterned Anti-Reflective Coating (ARC) layer and a patterned final conductor layer.

15. The method of claim 14 wherein the kerf is from about is from about 1E6 to about 1.5E6 angstroms in width upon the semiconductor substrate and the kerf is from about 1E4 to about 2E4 angstroms in depth within the semiconductor substrate.

16. The method of claim 14 wherein the blanket final conductor layer is formed of a metal alloy formed at least in part of aluminum, the blanket final conductor layer also being formed at a thickness of from about 4000 to about 8000 angstroms.

17. The method of claim 14 wherein the blanket Anti-Reflective Coating (ARC) layer is formed of a titanium nitride, the blanket Anti-Reflective Coating (ARC) layer also being formed at a thickness of from about 250 to about 1500 angstroms.

18. The method of claim 14 wherein the aperture is from about 1E6 to about 1.5E6 angstroms in width and wherein the aperture is from about 1E4 to about 2E4 angstroms in depth.

19. The method of claim 14 wherein the buffer layer is formed from an organic polymer material.

20. The method of claim 19 wherein the organic polymer material has a viscosity of from about 10 to about 50 centipoise, as coated.

21. The method of claim 14 wherein the blanket photoresist layer is formed from a photoresist material chosen from the group of photoresist materials consisting of novolak photoresist materials and Poly Methyl Meth Acrylate (PMMA) photoresist materials.

22. The method of claim 14 wherein the blanket photoresist layer is formed at a thickness of from about 5000 to about 15000 angstroms upon the surface of the semiconductor substrate.

23. The method of claim 14 wherein the patterned final conductor layer and the patterned Anti-Reflective Coating (ARC) layer are from about 6E4 to about 7E4 angstroms from the edge of the kerf.

* * * * *

UNITED STATES PATENT AND TRADEMARK OFFICE
CERTIFICATE OF CORRECTION

PATENT NO. : 5,633,210
DATED : 5/27/97
INVENTOR(S) : Bao R. Yang, Sen F. Chen, Wen C. Chang, Po-Tao Chu It is certified that error appears in the above-indentified patent and that said Letters Patent is hereby corrected as shown below: Title page:

Item (75), correct inventor's name from "Po-Tau Chu" to --Po-Tao Chu--

Signed and Sealed this

Ninth Day of September, 1997

Attest:

BRUCE LEHMAN

Attesting Officer

Commissioner of Patents and Trademarks